United States Patent
Arai et al.

(10) Patent No.: US 10,622,263 B2
(45) Date of Patent: Apr. 14, 2020

(54) SEMICONDUCTOR DEVICE HAVING SOI SUBSTRATE AND FIRST AND SECOND DIFFUSION LAYER

(71) Applicants: LAPIS Semiconductor Co., Ltd., Yokohama (JP); Inter-University Research Institute Corporation High Energy Accelerator Research Organization, Ibaraki (JP)

(72) Inventors: Yasuo Arai, Ibaraki (JP); Masao Okihara, Tokyo (JP); Hiroki Kasai, Miyagi (JP)

(73) Assignees: LAPIS SEMICONDUCTOR CO., LTD., Yokohama (JP); Inter-University Research Institute Corporation High Energy Accelerator Research Organization, Ibaraki (JP)

( * ) Notice: Subject to any disclaimer, the term of this patent is extended or adjusted under 35 U.S.C. 154(b) by 0 days.

(21) Appl. No.: 15/870,503

(22) Filed: Jan. 12, 2018

(65) Prior Publication Data

US 2018/0138232 A1    May 17, 2018

Related U.S. Application Data

(60) Continuation of application No. 15/064,686, filed on Mar. 9, 2016, now Pat. No. 9,899,448, which is a (Continued)

(30) Foreign Application Priority Data

Mar. 9, 2010 (JP) .................................. 2010-052173

(51) Int. Cl.
*H01L 21/84* (2006.01)
*H01L 27/12* (2006.01)
(Continued)

(52) U.S. Cl.
CPC ............ *H01L 21/84* (2013.01); *H01L 21/225* (2013.01); *H01L 21/2652* (2013.01);
(Continued)

(58) Field of Classification Search
CPC . H01L 23/535; H01L 21/743; H01L 27/1203; H01L 27/1461; H01L 27/14612;
(Continued)

(56) References Cited

U.S. PATENT DOCUMENTS 5,751,041 A *  5/1998  Suzuki ................ H01L 21/8221
                                                         257/352
6,104,075 A *  8/2000  Karaki .................... G01K 7/226
                                                         257/417
(Continued)

FOREIGN PATENT DOCUMENTS

JP        62183554 A    8/1987
JP        09115999 A    5/1997
(Continued)

*Primary Examiner* — Khiem D Nguyen
(74) *Attorney, Agent, or Firm* — Rabin & Berdo, P.C.

(57) ABSTRACT

There is provided a semiconductor device and a method for manufacturing a semiconductor device. Within the N-type semiconductor layer formed from a high resistance N-type substrate, the P-type well diffusion layer and P-type extraction layer are formed and are fixed to ground potential. Due thereto, a depletion layer spreading on the P-type well diffusion layer side does not reach the interlayer boundary between the P-type well diffusion layer and the buried oxide film. Hence, the potential around the surface of the P-type well diffusion layer is kept at a ground potential. Accordingly, when the voltages are applied to the backside of the N-type semiconductor layer and a cathode electrode, a channel region at the MOS-type semiconductor formed as a P-type semiconductor layer is not activated. Due thereto,
(Continued)

leakage current that may occur independently of a control due to the gate electrode of a transistor can be suppressed.

5 Claims, 13 Drawing Sheets

Related U.S. Application Data continuation of application No. 14/598,364, filed on Jan. 16, 2015, now Pat. No. 9,318,391, which is a division of application No. 13/583,409, filed as application No. PCT/JP2011/055546 on Mar. 9, 2011, now Pat. No. 8,963,246.

(51) Int. Cl.
| | | |
|---|---|---|
| *H01L 27/144* | (2006.01) | |
| *H01L 29/861* | (2006.01) | |
| *H01L 21/265* | (2006.01) | |
| *H01L 21/225* | (2006.01) | |
| *H01L 29/66* | (2006.01) | |
| *H01L 27/146* | (2006.01) | |
| *H01L 29/786* | (2006.01) | |
| *H01L 27/06* | (2006.01) | |

(52) U.S. Cl.
CPC ...... *H01L 27/1203* (2013.01); *H01L 27/1207* (2013.01); *H01L 27/1443* (2013.01); *H01L 27/1461* (2013.01); *H01L 27/14612* (2013.01); *H01L 27/14658* (2013.01); *H01L 29/66477* (2013.01); *H01L 29/8611* (2013.01); *H01L 27/0629* (2013.01); *H01L 29/78648* (2013.01)

(58) Field of Classification Search
CPC . H01L 21/84; H01L 27/0629; H01L 27/1021; H01L 29/66477; H01L 29/8611; H01L 27/14658
See application file for complete search history.

(56) References Cited

U.S. PATENT DOCUMENTS

| | | | |
|---|---|---|---|
| 6,424,013 B1 * | 7/2002 | Steinhoff | ............ H01L 27/0277 257/355 |
| 6,611,024 B2 * | 8/2003 | Ang | ........................ H01L 21/84 257/350 |
| 6,689,648 B2 | 2/2004 | Ko et al. | |
| 6,917,078 B2 * | 7/2005 | Bhattacharyya | ... G11C 16/0466 257/347 |
| 8,823,137 B2 * | 9/2014 | Kikuchi | .............. H01L 27/0802 257/536 |
| 8,963,246 B2 | 2/2015 | Arai et al. | |
| 9,899,448 B2 * | 2/2018 | Arai | .................. H01L 27/14658 |
| 2004/0099910 A1 * | 5/2004 | Choe | .................. H01L 21/6835 257/347 |
| 2005/0176184 A1 | 8/2005 | Okihara | |
| 2005/0269642 A1 | 12/2005 | Minami | |
| 2006/0237726 A1 * | 10/2006 | Iwamatsu | ........... H01L 27/0811 257/72 |
| 2006/0246605 A1 * | 11/2006 | Jung | ....................... H01L 21/84 438/1 |
| 2007/0069306 A1 * | 3/2007 | Kapoor | ............... H01L 27/0629 257/369 |
| 2007/0210418 A1 * | 9/2007 | Nakajima | ............... H01L 21/84 257/547 |
| 2008/0237769 A1 * | 10/2008 | Okihara | ........... H01L 27/14623 257/435 |
| 2009/0111235 A1 * | 4/2009 | Clevenger | ......... H01L 21/76898 438/386 |
| 2009/0127605 A1 * | 5/2009 | Shiraki | .................... H01L 21/84 257/296 |
| 2010/0187586 A1 * | 7/2010 | Pellela | .................... H01L 21/84 257/300 |
| 2010/0248410 A1 * | 9/2010 | Okamura | ................ H01L 27/14 438/59 |
| 2011/0101458 A1 * | 5/2011 | Okihara | .............. H01L 27/0266 257/347 |

FOREIGN PATENT DOCUMENTS

| | | |
|---|---|---|
| JP | 9162417 A | 6/1997 |
| JP | 2000-208714 A | 7/2000 |
| JP | 2002-124657 A | 4/2002 |
| JP | 2005-347539 A | 12/2005 |
| JP | 2007-142145 A | 6/2007 |
| JP | 2007-242950 A | 9/2007 |
| JP | 2007-294765 A | 11/2007 |

* cited by examiner

SEMICONDUCTOR DEVICE HAVING SOI SUBSTRATE AND FIRST AND SECOND DIFFUSION LAYER

CROSS-REFERENCE TO RELATED APPLICATIONS

This is a Continuation of U.S. application Ser. No. 15/064,686, filed on Mar. 9, 2016, and issued on Feb. 20, 2018, as U.S. Pat. No. 9,899,448, which was a Continuation of U.S. application Ser. No. 14/598,364, filed on Jan. 16, 2015, and issued on Apr. 19, 2016, as U.S. Pat. No. 9,318,391, which was a Divisional of U.S. application Ser. No. 13/583,409, filed on Sep. 7, 2012, and issued on Feb. 24, 2015, as U.S. Pat. No. 8,963,246, which was a National Stage application of PCT/JP2011/055546, filed on Mar. 9, 2011. Furthermore, this application claims the benefit of priority of Japanese application 2010-052173, filed on Mar. 9, 2010. The disclosures of the prior U.S. and Japanese applications are incorporated herein by reference.

TECHNICAL FIELD

The present invention relates to a semiconductor device and a method for manufacturing a semiconductor device.

BACKGROUND ART

Generally, there is a known semiconductor device in which diodes and transistors are commonly provided on a silicon on insulator (SOI) substrate. For example, JP-A-2002-124657 describes a CMOS image sensor in which a photodiode and a transistor for amplification are disposed on a common silicon substrate. There, the transistor for amplification amplifies the signal electrical charges that are converted by photoelectric conversion and accumulated within the silicon substrate by the photodiode.

SUMMARY OF INVENTION

Technical Problem

FIG. 22 shows an example of a conventional semiconductor device in which diodes and a transistor are provided on a common SOI substrate. The semiconductor device shown in FIG. 22 is a sensor used for detecting X-ray or the like.

The SOI substrate of the semiconductor device 100 includes an N-type semiconductor layer 114, a buried oxide film 116 and a P-type semiconductor layer 1220. On the SOI substrate, an MOS-type transistor 182 and a diode 184 are formed. Note that in a sensor used for detecting X-ray or the like, in order to enhance detection sensitivity during radiation incidence, it is necessary to use a substrate with a low concentration and a high resistance or to deplete the charges from the entire substrate by applying a bias voltage of a few hundred volts to the backside of the substrate.

However, in the semiconductor device 100, the voltage that is applied to the backside of the N-type semiconductor layer 114 in order to deplete the N-type semiconductor layer 114 also reaches, via the buried oxide film 116, to the P-type semiconductor layer 1220 that is formed on the buried oxide film 116. Due to this phenomenon, in the MOS-type transistor 182 formed in the P-type semiconductor layer 1220, besides the primary current path that is controlled by a gate electrode 130 formed by a polysilicon film, a channel region on a side of the buried oxide film 116 is activated as a separate current path due to the bias voltage reaching from the N-type semiconductor layer 114. Due thereto, leakage current 183 may occur independently of the control due to the gate electrode 130.

The present invention is proposed to solve the problem described above and provides a semiconductor device and a method for manufacturing a semiconductor device such that, in the semiconductor device in which diodes and transistors are commonly provided on the same substrate, leakage current that may occur independently of a control due to the gate electrode of a transistor can be suppressed.

Solution to Problem

To achieve the object described above, a semiconductor device according to the first aspect of the present invention includes: a second-conductive-type semiconductor layer in which, a first first-conductive-type region is formed in a predetermined first region on one surface side of the second-conductive-type semiconductor layer, a second first-conductive-type region with a higher impurity concentration than that in the first first-conductive-type region is formed in a portion of the first first-conductive-type region, and a first second-conductive-type region with a high impurity concentration and a third first-conductive-type region are formed at a portion of a second region adjacent to the first region; an oxide film layer that is laminated on the first region and the second region on the one surface side of the second-conductive-type semiconductor layer; a MOS-type transistor that includes a first-conductive-type semiconductor layer laminated on the oxide film layer in the first region; a first electrode that is connected to the second first-conductive-type region; a second electrode that is connected to the first second-conductive-type region; and a third electrode that is connected to the third first-conductive-type region.

A semiconductor device according to the second aspect of the present invention is the semiconductor device further including a voltage applying unit for applying voltage to a surface opposite to the one surface of the second-conductive-type semiconductor layer and the second electrode, wherein the first electrode and the third electrode are connected to ground.

A semiconductor device according to the third aspect of the present invention is the semiconductor device wherein a second second-conductive-type region is formed in the first first-conductive-type region so as to be in contact with the oxide film layer and, a third second-conductive-type region with a higher impurity concentration than that in the second second-conductive-type region is formed in a portion of the second-conductive-type second region, wherein the semi-conductor device comprises a fourth electrode connected to the third second-conductive-type region.

A semiconductor device according to the fourth aspect of the present invention is the semiconductor device further including a voltage applying unit for applying voltage to a surface opposite to the one surface of the second-conductive-type semiconductor layer and the second electrode, wherein the first electrode, the third electrode and the fourth electrode are connected to ground.

A method for manufacturing a semiconductor device according to the fifth aspect of the present invention includes: laminating an oxide film layer and a first-conductive-type semiconductor layer on a second-conductive-type semiconductor layer in order; forming an active region in the first-conductive-type semiconductor layer; forming an insulating film on the first-conductive-type semiconductor layer; forming a first first-conductive-type region by diffusing, based on the position of the active region, a first-conductive-type impurity within a first region of the second-conductive-type semiconductor layer that includes a lower portion of the active region; forming a MOS-type transistor in the active region; removing the oxide film layer from a predetermined region in which a first electrode, a second electrode and a third electrode of the first-conductive-type semiconductor layer are to be formed; forming, in the first first-conductive-type region, a second first-conductive-type region by diffusing the first-conductive-type impurity within the predetermined region from which the oxide film layer has been removed and on which the first electrode is to be formed and, forming a third first-conductive-type region by diffusing the first-conductive-type impurity within the predetermined region on which the third electrode is to be formed; forming a second-conductive-type region by diffusing a second-conductive-type impurity within the predetermined region from which the oxide film layer has been removed and in which the second electrode is to be formed; and forming the first electrode, the second electrode and the third electrode.

A method for manufacturing the semiconductor device according to the sixth aspect of the present invention further includes: forming, between the process of forming the insulating film and the process of forming the first first-conductive-type region, a second second-conductive-type region by diffusing, based on the position of the active region, the second-conductive-type impurity within a first region of the second-conductive-type semiconductor layer including a lower portion of the active region.

Advantageous Effects of Invention

According to the above aspects of the present invention, in the semiconductor device in which a diode and the transistor are commonly provided on a same substrate, leakage current that may occur independently of a control by the gate electrode of a transistor can be suppressed.

BRIEF DESCRIPTION OF THE DRAWINGS

Exemplary embodiments of the present invention will be described in detail based on the following figures, wherein.

DESCRIPTION OF EMBODIMENTS

First Embodiment

Hereinafter, a field-effect transistor will be referred as a MOS-type transistor.

Figure 1:
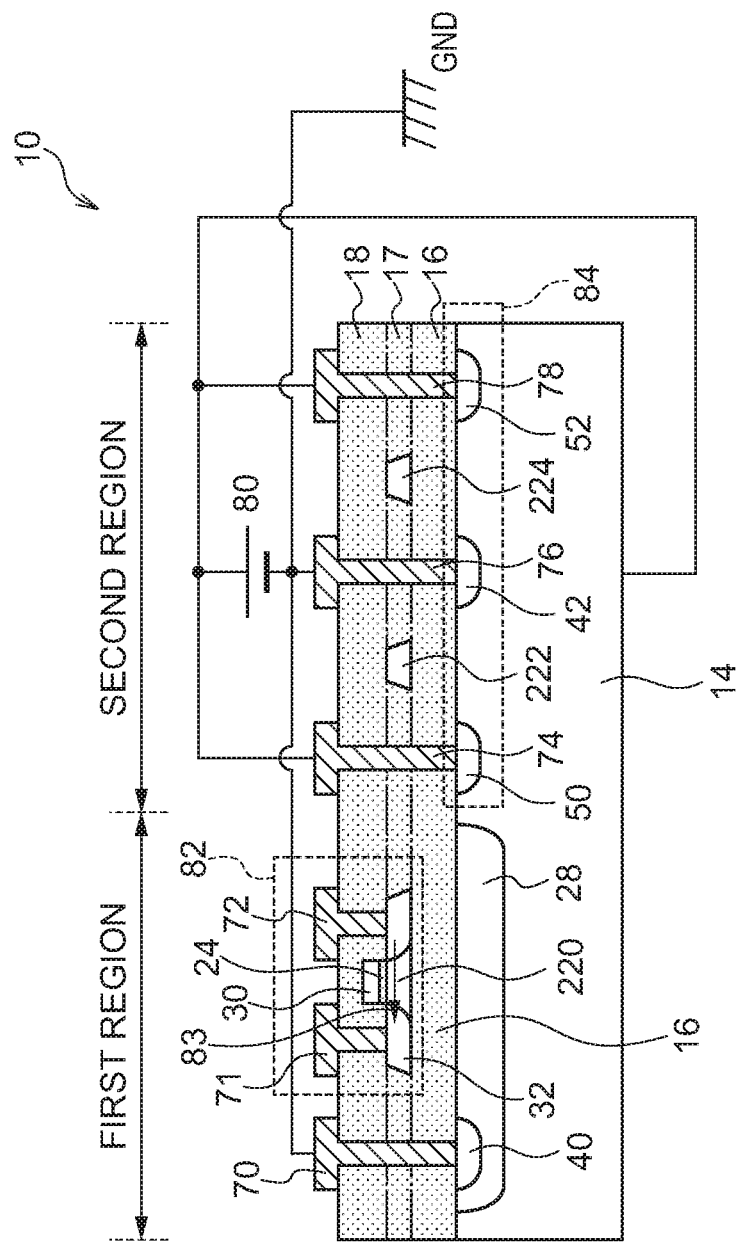
FIG. 1 is a cross-sectional view of an example of a schematic configuration of a semiconductor device according to a first embodiment.

A configuration of the semiconductor device of the present embodiment will be described first. FIG. 1 shows a cross-sectional view of an example of a schematic configuration of the semiconductor device of the present embodiment. In the semiconductor device 10 of the present embodiment, an N-channel MOS-type transistor 82 and a diode 84 are formed on an SOI substrate (SOIS) in which an N-type semiconductor layer 14, a buried oxide film 16 and a P-type semiconductor layer 22 (220, 222, and 224) are laminated. For convenience of explanation, a region in which the MOS-type transistor 82 is formed on the SOI substrate will be referred to as a first region, and a region in which the diode 84 is formed will be referred to as a second region. The diode 84 is a photo diode, and thus the semiconductor device is a photodiode-on-SOIS device.

A P-type well diffusion layer 28 is formed in the first region of a surface (a side contacting the buried oxide film 16) of the N-type semiconductor layer 14. A P-type extraction electrode region 40 having a higher impurity concentration than that of the P-type well diffusion layer 28 is formed on a surface of the P-type well diffusion layer 28. Moreover, a P-type extraction electrode region 42 and N-type extraction electrode regions 50 and 52 are formed in the second region of the surface of the N-type semiconductor layer 14. The P-type extraction electrode region is a part of the diode 84. The N-type extraction electrode regions 50 and 52 are formed to have a higher impurity concentration than that of the N-type semiconductor layer 14.

P-type semiconductor layers 220, 222 and 224 are laminated on the buried oxide film 16 that is laminated on the N-type semiconductor layer 14. Moreover, the MOS-type transistor 82 is formed in the first region on top of the buried oxide film 16.

The MOS-type transistor 82 is formed by the P-type semiconductor layer 220, lightly doped drain (LDD) region 32 having low impurity concentration that is provided between a source, a drain and a channel, a gate oxide film 24, a gate electrode 30 and extraction electrodes 71 and 72 respectively forming a source and a drain of the MOS-type transistor 82.

Further, an oxide film 17 and an interlayer film 18 are laminated on the buried oxide film 16.

Moreover, an extraction electrode 70 which is a P-type well electrode is connected with the P-type extraction electrode region 40. An anode 76 is connected with a P-type extraction electrode region 42. Cathodes 74 and 78 are connected with N-type extraction electrode regions 50 and 52, respectively.

A power source 80 applies a bias voltage to cathodes 74 and 78 of the diode 84 and to the backside (the side not contacting the buried oxide film 16) of the N-type semiconductor layer 14, in order to deplete the N-type semiconductor layer 14. According to the present embodiment, as a concrete example, a bias voltage of a few hundreds of volts is applied. The electrode 70 formed on the semiconductor device 10 and the anode 76 of the diode 84 are grounded.

Thus, in the semiconductor device 10 of the present embodiment, within the N-type semiconductor layer 14 that is formed from a high resistance N-type substrate, the P-type well diffusion layer 28 is formed and is fixed to ground potential. Due thereto, when a high voltage is applied by the power source 80 to the backside of the N-type semiconductor layer 14 in order to deplete the N-type semiconductor layer 14, a depletion layer spreads within a PN junction surface between the P-type well diffusion layer 28 and the N-type semiconductor layer 14. Of such a depletion layer, the part spreading on the P-type well diffusion layer 28 side does not reach the interlayer boundary between the P-type well diffusion layer 28 and the buried oxide film 16. Hence, the potential around the surface of the P-type well diffusion layer 28 is kept at a ground potential. Accordingly, the voltage applied to the backside of the N-type semiconductor layer 14 by the power source 80 does not reach the interlayer boundary of the P-type semiconductor layer 220 at the buried oxide film 16 side.

As explained above, according to the semiconductor device 10 of the present embodiment, when a voltage is applied by the power source 80 to the backside of the N-type semiconductor layer 14 and the cathode electrodes 74 and 78, a channel region formed in the P-type semiconductor layer 220 at the buried oxide film 16 side of the MOS-type transistor 82 is not activated. Accordingly, a leakage current 83 that occurs independently of a control due to the gate electrode 30 may be suppressed.

Next, a method for manufacturing the semiconductor device 10 of the present embodiment will be described.

Figure 2:
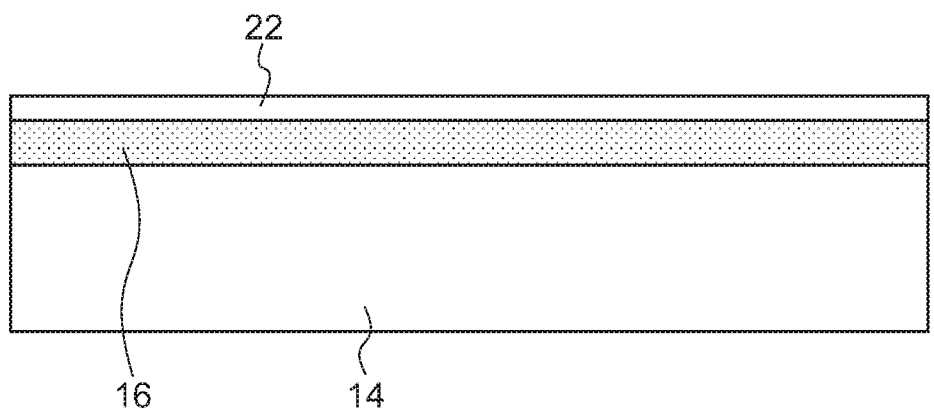
FIG. 2 is a process chart related to an example of a method for manufacturing the semiconductor device according to the first embodiment.

First, as shown in FIG. 2, an SOI substrate is prepared in which the buried oxide film 16 is interposed between the P-type semiconductor layer 22, which is laminated at the upper side thereof, and the N-type semiconductor layer 14, which is laminated at the lower side thereof. For instance, an N-type substrate which has a thickness of about 700 um and a specific resistance of 10 kΩ·cm may be used for the N-type semiconductor layer 14. An $SiO_2$ oxide film which has a thickness of about 2000 A (angstrom) may be used for the buried oxide film 16. A P-type substrate which has a thickness of about 880 A (angstrom) and a specific resistance of 10 Ω·cm may be used for the P-type semiconductor layer 22.

A pad oxide film ($SiO_2$) is formed on the upper surface of the P-type semiconductor layer 22 and, a nitride film ($Si_3N_4$) is formed by CVD or the like on the pad oxide film (not shown). Then, photoresist is applied to a region in which a field oxide film is to be formed. The nitride film is removed by etching, and the field oxide film 17 is formed by Local Oxidization of Silicon (LOCOS) process using the nitride film as a mask. Thereafter, the nitride film and the pad oxide film are removed. Accordingly, as shown in FIG. 3, the P-type semiconductor layers 220, 222 and 224 that serve as active regions are formed.

Figure 3:
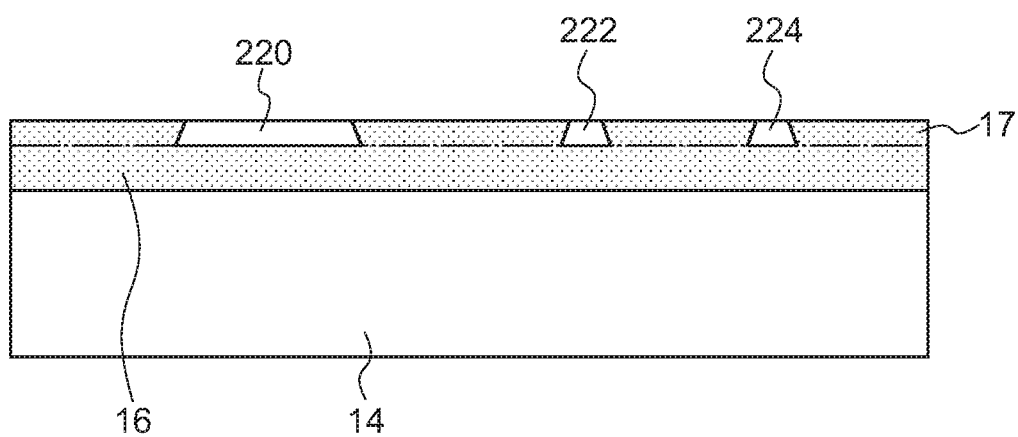
FIG. 3 is a process chart related to a process following the process shown in FIG. 2.
Figure 4:
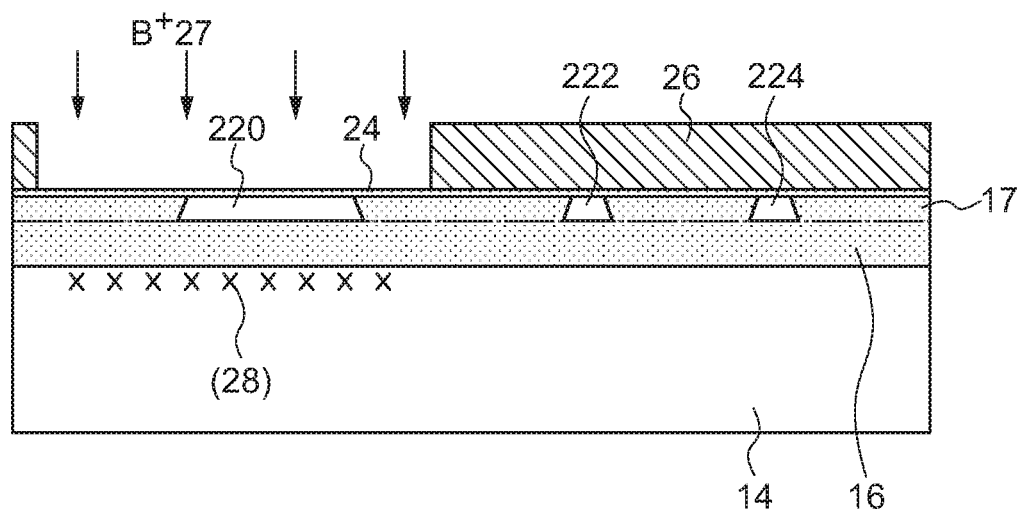
FIG. 4 is a process chart related to a process following the process shown in FIG. 3.

Further, as shown in FIG. 4, the gate oxide film 24 is formed by CVD or the like on the P-type semiconductor layers 220, 222 and 224 and the surface of the field oxide film 17 (the entire upper surface as shown in FIG. 3). A region, other than the region corresponding to the position in which the P-type well diffusion layer 28 of the first region is to be formed, is covered by photoresist 26. Here, the photoresist 26 is positionally aligned with the P-type semiconductor layer 220, which is the active region of the MOS-type transistor 82. As a concrete example, $B^+(B^+27)$ may serve as a P-type impurity to be implanted with an implantation energy of 100 keV and with a dose amount of about 1.0E12 to 1.0E13 $cm^{-2}$. Thus, a state is attained in which the impurity for forming the P-type well diffusion layer 28 has been implanted to the N-type semiconductor layer 14.

Figure 5:
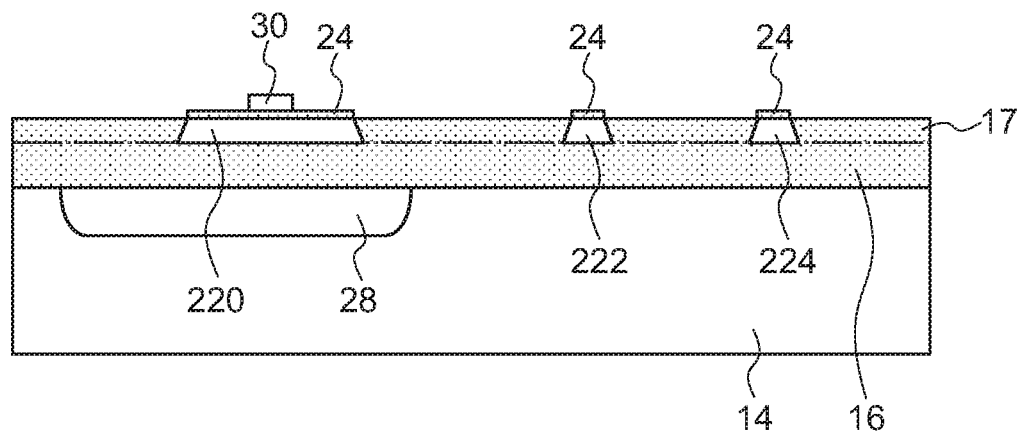
FIG. 5 is a process chart related to a process following the process shown in FIG. 4.

Further, after removing the photoresist 26, a polysilicon film is deposited. Then, the polysilicon film to which a patterning is applied by the photoresist is dry etched (process not shown), and the gate electrode 30 is formed on the gate oxide film 24 on the P-type semiconductor layer 220 as shown in FIG. 5.

Figure 6:
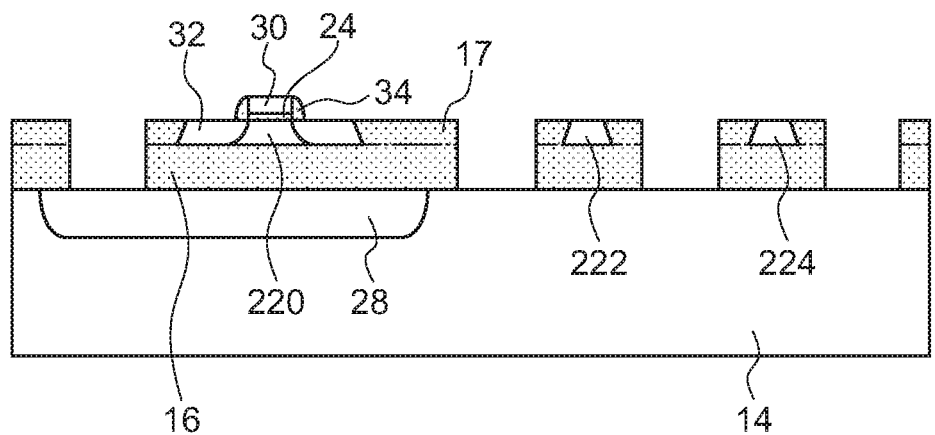
FIG. 6 is a process chart related to a process following the process shown in FIG. 5.

Further, as shown in FIG. 6, the P-type semiconductor layer 220 is shallowly, and with low concentration, ion-implanted with impurity ion for source and drain to form the LLD region 32. Then, a $Si_3N_4$ film or the like is formed so as to cover a gate pattern. Next, a side wall spacer 34 is formed on a side wall portion of the gate electrode 30 by dry etching. Thereafter, ion for drain is implanted again with high concentration to form the MOS-type transistor 82. After forming the MOS-type transistor 82, regions other than the predetermined regions that are to be formed on the N-type semiconductor layer 14 corresponding to the respective extraction electrodes of P-type and N-type (electrodes 70, 74, 76 and 78) are covered by the photoresist. Then, etching is performed to the oxide film 17 and the buried oxide film 16 with photoresist as a mask. Thereafter, the photoresist is removed.

Figure 7:
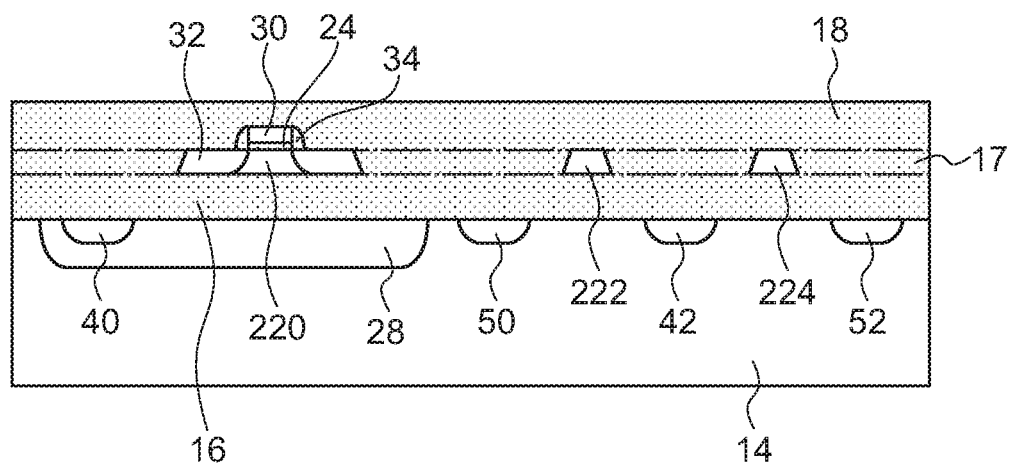
FIG. 7 is a process chart related to a process following the process shown in FIG. 6.

Further, as a concrete example, the region in which the N-type extraction electrode regions 50 and 52 are formed is implanted with $P^+$ as an impurity at an implantation energy of 60 keV and with a dose amount of about 5.0E15 $cm^{-2}$. The N-type extraction electrode regions 50 and 52 also serve as cathode electrodes of the diode 84. Thus, the N-type extraction electrode regions 50 and 52 are formed as shown in FIG. 7. Moreover, as a concrete example, the region in which the P-type extraction electrode region 42 and the P-type extraction electrode region 40 are formed is implanted with $B^+$ as an impurity at an implantation energy of 40 keV and with a dose amount of about 5.0E15 $cm^{-2}$. The P-type extraction electrode region 42 also serves as the anode of the diode 84. Thus, the P-type extraction electrode region 42 and the P-type extraction electrode region 40 are formed, as shown in FIG. 7. The state is attained in which the impurity concentration of the P-type extraction electrode region 40 is higher than that in the P-type well diffusion layer 28. After forming the P-type extraction electrode regions 40 and 42 and the N-type extraction electrode regions 50 and 52, CVD film is deposited to form the interlayer film 18.

Figure 8:
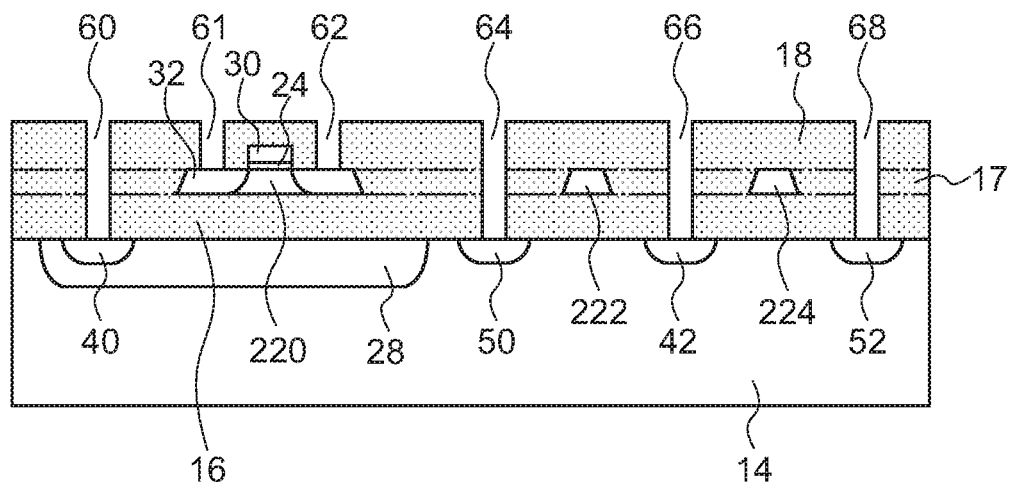
FIG. 8 is a process chart related to a process following the process shown in FIG. 7.

Further, predetermined regions other than the region in which electrodes (extraction electrodes of the P-type semiconductor layer 220) of the MOS-type transistor 82 and extraction electrodes of the N-type semiconductor layer 14 are to be formed, are masked by photoresist and etched. Thus, contact holes 60, 61, 62, 64, 66 and 68 are formed, as shown in FIG. 8. Then, a metal layer is deposited inside the contact holes 60, 61, 62, 64, 66 and 68 by sputtering.

Figure 9:
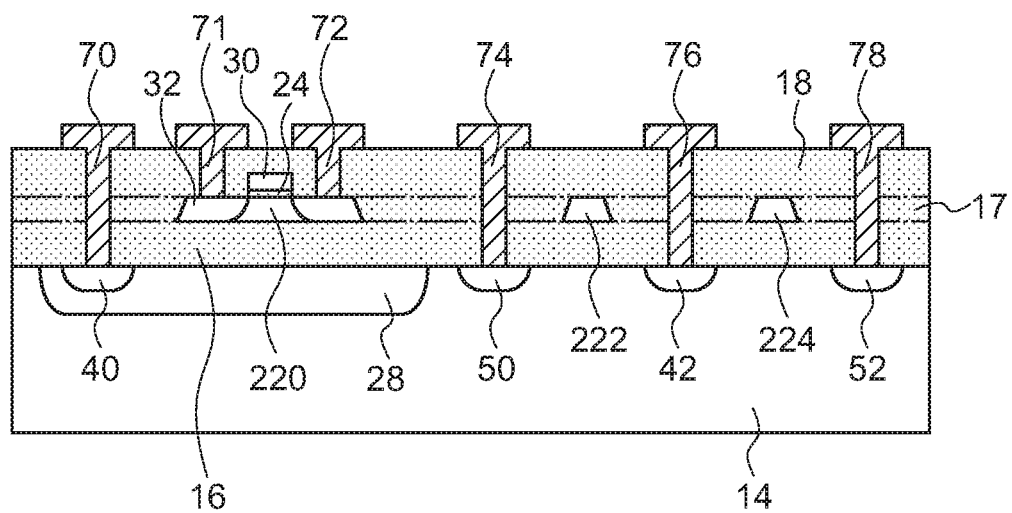
FIG. 9 is a cross-sectional view of an example of a schematic configuration of the semiconductor device according to the first embodiment.

Finally, the part of the metal layer formed by sputtering other than the regions in which electrodes are to be formed is etched. Thus, the extraction electrodes 70, 71, 72, 74, 76 and 78 are formed, as shown in FIG. 9. According to these processes described above, the semiconductor device 10 of this embodiment is manufactured.

In this manner, according to the method for manufacturing the semiconductor device 10 of this embodiment, the P-type well diffusion layer 28 is formed after forming the P-type semiconductor layers 220, 222 and 224, which are the active region in the P-type semiconductor layer 22. Due thereto, it is possible to adjust a position of the photolithography using the active region (the P-type semiconductor layer 220) in a photolithography process before implanting the impurity for forming the P-type well diffusion layer 28. Moreover, the MOS-type transistor 82 is formed in the P-type semiconductor layer 220 after implanting the impurity for forming the P-type well diffusion layer 28. Due thereto, the P-type well diffusion layer 28 can undergo sufficient heat treatment.

As described above, according to the method for manufacturing the semiconductor device 10 of this embodiment, ample heat treatment can be applied to the region implanted with the impurity, after the P-type well diffusion layer 28 is formed with a minimum shift length during photolithography adjustment of the active region (the P-type semiconductor layer 220) formed in the P-type semiconductor layer 22, and the impurity is implanted to the N-type semiconductor layer 14 for forming the P-type well diffusion layer 28. Due thereto, the P-type well diffusion layer 28 may be formed in the N-type semiconductor layer 14 to a position of greater depth Second Embodiment A semiconductor device according to a second embodiment of the present invention will be described in detail with reference to figures below.

Figure 10:
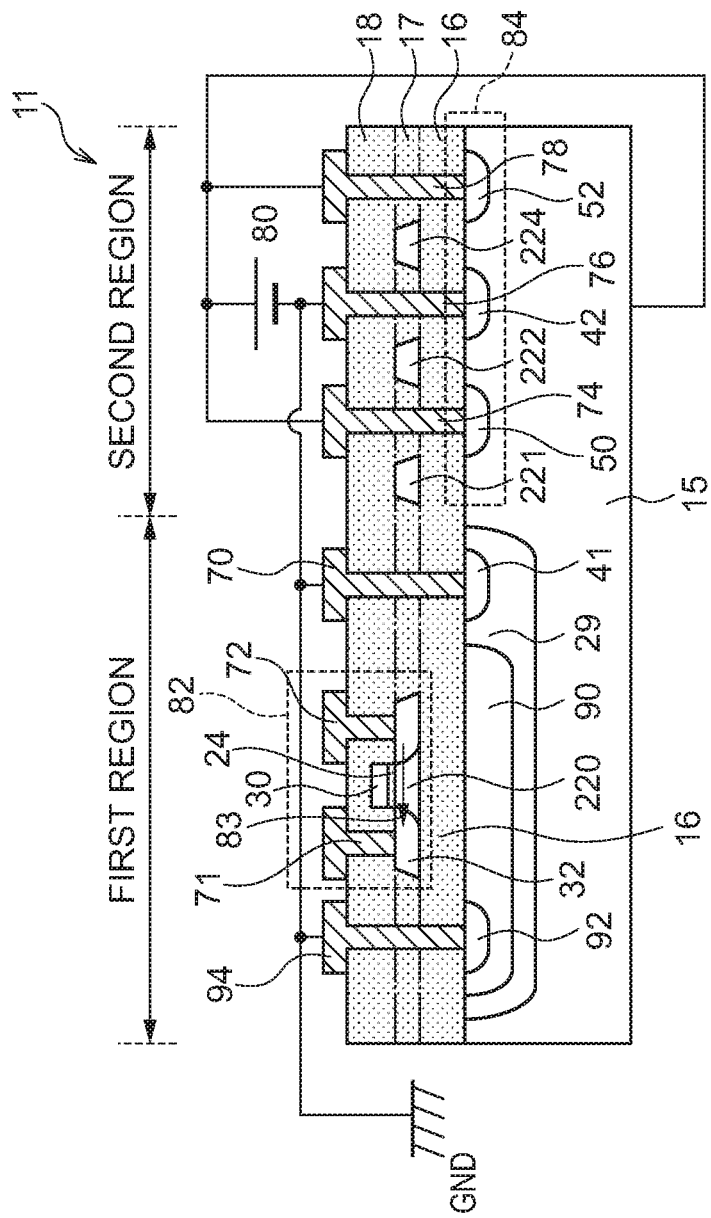
FIG. 10 is a cross-sectional view of an example of a schematic configuration of a semiconductor device according to a second embodiment.

First, a configuration of the semiconductor device of this embodiment will be described. FIG. 10 shows a cross-sectional view of an example of a schematic configuration of the semiconductor device 11 of this embodiment. Since the semiconductor device 11 of this embodiment has a configuration similar to the semiconductor device 10 of the first embodiment, the same reference numerals are used for the same portions and detail explanation therefor will be omitted.

According to the N-type semiconductor layer 15 configured in the semiconductor device 11 of this embodiment, an N-type well diffusion layer 90 is formed in the P-type well diffusion layer 29 so that the N-type well diffusion layer 90 is in contact with the buried oxide film 16. Further, an N-type extraction electrode region 92 with a higher impurity concentration than that in the N-type well diffusion layer 90 is formed on a surface of the N-type well diffusion layer 90. An electrode 94 which is an N-type well electrode is connected with the N-type extraction electrode region 92. The electrode 94 along with the electrode 70, which is a P-type well electrode, and the electrode 76, which serves as an anode electrode of the diode 84, are connected to ground.

Figure 11:
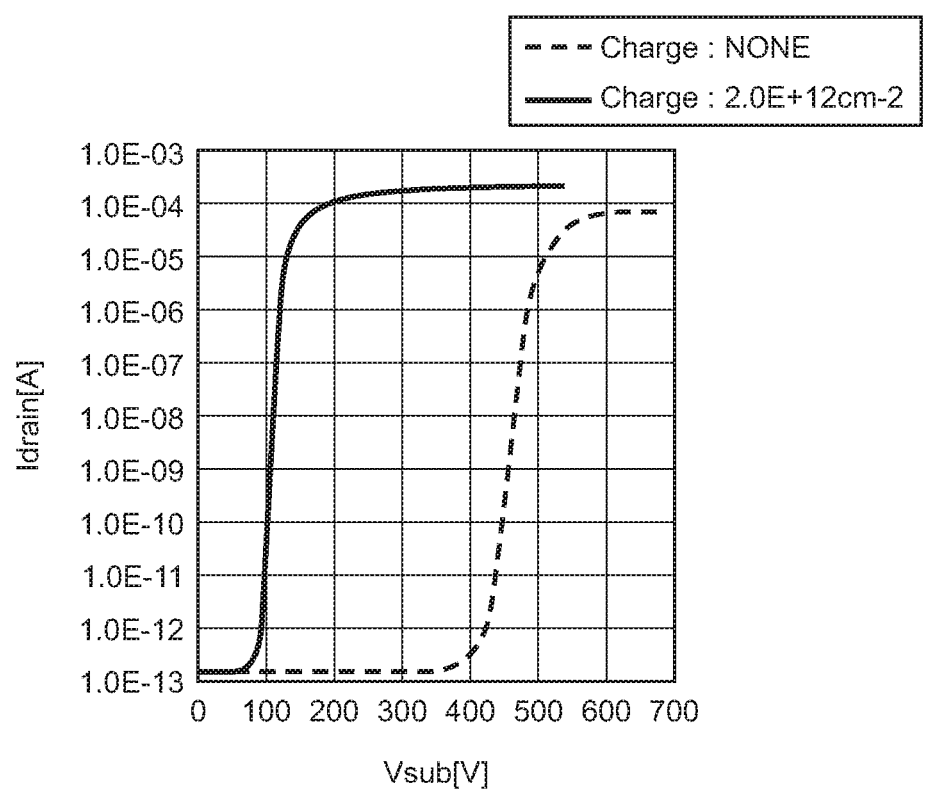
FIG. 11 is an explanatory diagram to explain a case in which X-ray is radiated at the semiconductor device according to the first embodiment over a long period.
Figure 12:
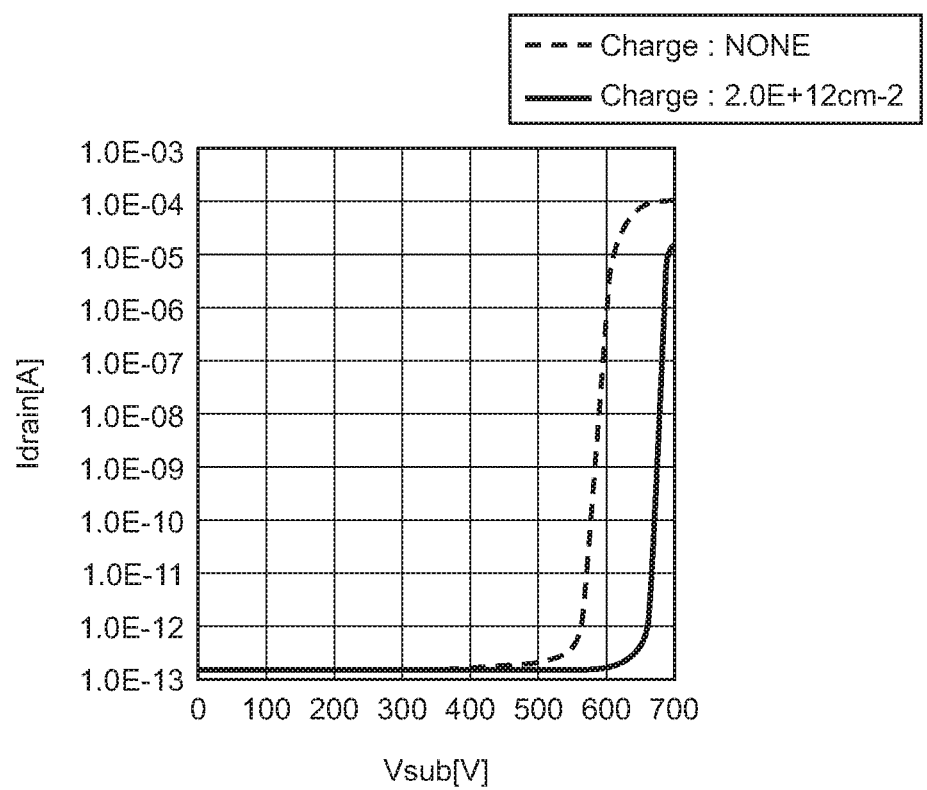
FIG. 12 is an explanatory diagram to explain a case in which X-ray is radiated at the semiconductor device according to the second embodiment over a long period.

In general, when the semiconductor device 10 is used for an X-ray sensor, it is known that insulating films (the buried oxide film 16, the oxide film 17 and the interlayer film 18) of the semiconductor device 10 is charged positively (plus) due to the X-ray radiation. Further, continued exposure to the X-ray radiation causes the amount of accumulated electrical charges to increase. For example, in the semiconductor device 10 according to the first embodiment, the surface (the side of the face that contacts the buried oxide film 16) of the P-type well diffusion layer 28 may in some cases be depleted, especially due to those electrical charges accumulated around the interlayer boundary between the buried oxide film 16 and the N-type semiconductor layer 14 among the positive electrical charges accumulated by the X-ray radiation. In such a case, at the time when the depletion layer spreading from the P-type well diffusion layer 28 side and the depletion layer spreading from PN junction surface side between the P-type well diffusion layer 28 and the N-type semiconductor layer 14 merge as the bias voltage is applied to the backside of the N-type semiconductor layer 14 by the power source 80, the potential around the surface of the P-type well diffusion layer 28 which has been kept to ground potential cannot be maintained. When the depletion layers merge, the bias voltage applied to the backside of the N-type semiconductor layer 14 reaches the MOS-type transistor 82 through the buried oxide film 16 and the leakage current 83 occurs independently of the control due to the gate electrode 30. Further, since the amount of accumulated electrical charges increases due to a long exposure to the X-ray radiation, the extent of spreading of the depletion layer from the P-type well diffusion layer 28 side also increases. FIG. 11 shows a relation between the amount of accumulated electrical charges and the bias voltage when the semiconductor device 10 of the first embodiment is exposed to the X-ray radiation over a long period. FIG. 12 shows a relation between the amount of accumulated electrical charges and the bias voltage when the semiconductor device 11 of the second embodiment is exposed to the X-ray radiation over a long period. As shown in FIGS. 11 and 12, the leakage current 83 occurs and the substrate bias decreases as the amount of accumulated electrical charges increases in the semiconductor device 10. On the other hand, the substrate bias does not decrease even if the amount of accumulated electrical charges increases in the semiconductor device 11.

Thus, according to the semiconductor device 11 of this embodiment, the depletion layer does not broaden, due to the fact that by forming the N-type well diffusion layer 90 in the N-type semiconductor layer 15 formed by the high resistance N-type substrate, electrons that are majority carriers accumulate on the surface of the N-type well diffusion layer 90 even when charges accumulate around the interlayer boundary between the buried oxide film 16 and the N-type semiconductor layer 15 due to the X-ray radiation. Further, according to the semiconductor device 11 of this embodiment, the N-type well diffusion layer 90 is formed in the P-type well diffusion layer 29. That is, the P-type well diffusion layer 29 is formed so as to cover the N-type well diffusion layer 90, and the N-type well diffusion layer 90 and the P-type well diffusion layer 29 are fixed to ground potential. Due thereto, the depletion layer does not spread between the N-type well diffusion layer 90 and the P-type well diffusion layer 29. Thereby, when high bias voltage is applied to the backside of the N-type semiconductor layer in order to deplete the N-type semiconductor, the depletion layer spreading at the P-type well diffusion layer 29, among the depletion layers spreading at the PN junction surface between the P-type well diffusion layer 29 and the N-type semiconductor layer 15, does not reach the junction surface with the N-type semiconductor layer 15. Due therto, the potential around the surface of the P-type well diffusion layer 29 is maintained at the ground potential, independently of the amount of electrical accumulated charges due to the X-ray radiation. Therefore, the voltage applied to the backside of the N-type semiconductor layer 15 from the power source voltage does not reach the interlayer boundary between the buried oxide film 16 side of the P-type semiconductor layer 220.

As explained above, according to the semiconductor device 11 of this embodiment, even though charges accumulate around the interlayer boundary between the buried oxide film 16 and the N-type semiconductor layer 15 due to the X-ray radiation, a channel region on the buried oxide film 16 side of the MOS-type transistor 82 formed in the P-type semiconductor layer 220 is not activated. Due thereto, it is possible to suppress leakage current 83 from occurring independently of the control due to the gate electrode 30.

Figure 13:
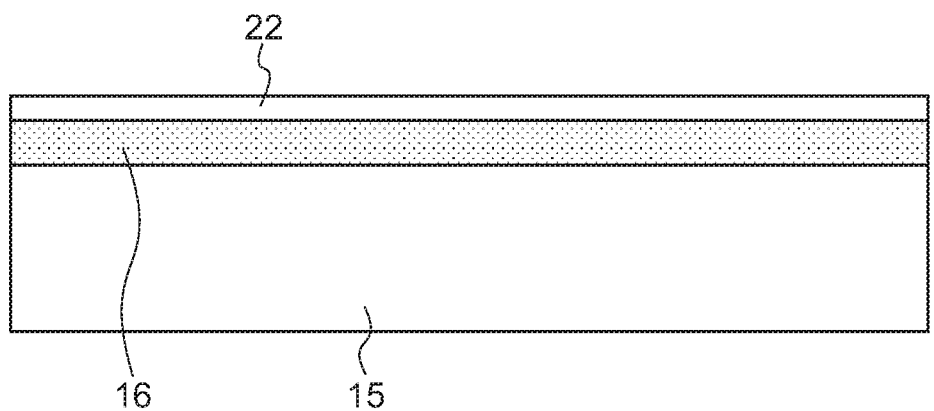
FIG. 13 is a process chart related to an example of a method for manufacturing the semiconductor device according to the second embodiment.

Next, a method for manufacturing the semiconductor device 11 of this embodiment will be described. Since the method for manufacturing the semiconductor device 11 of this embodiment has processes similar to those of the method for manufacturing semiconductor device 10 of the first embodiment, detailed descriptions for the same processes will be omitted. FIG. 13 of this embodiment corresponds to FIG. 2 of the first embodiment, FIG. 14 corresponds to FIG. 3, FIG. 16 corresponds to FIG. 4, FIG. 17 corresponds to FIG. 5, FIG. 18 corresponds to FIG. 6, FIG. 19 corresponds to FIG. 7 and FIG. 20 corresponds to FIG. 8 respectively.

First, as shown in FIG. 13, an SOI substrate is prepared, in which the P-type semiconductor layer 22 is laminated on upper side and the N-type semiconductor layer 15 is laminated on lower side, sandwiching the buried oxide film 16 in between.

Figure 14:
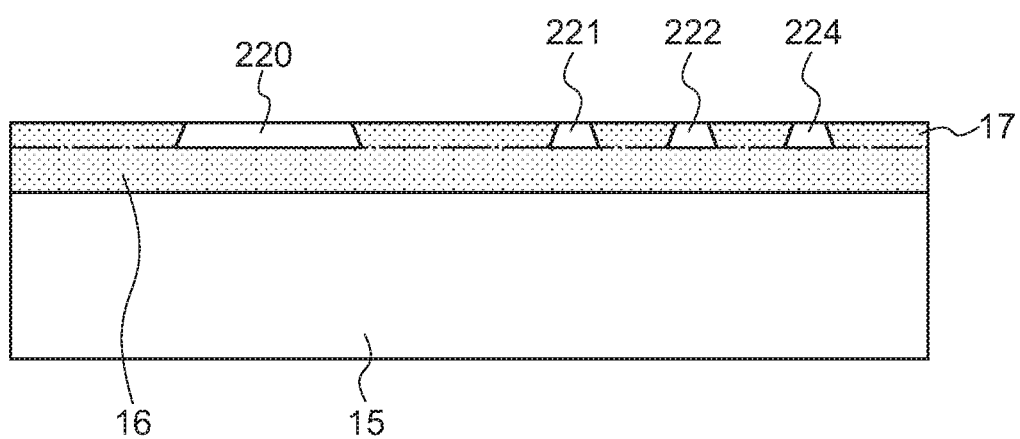
FIG. 14 is a process chart related to a process following the process shown in FIG. 13.

Further, the field oxide film 17 is formed by LOCOS formation method. Hence, as shown in FIG. 14, the P-type semiconductor layers 220, 222 and 224 which are active regions are formed.

Figure 15:
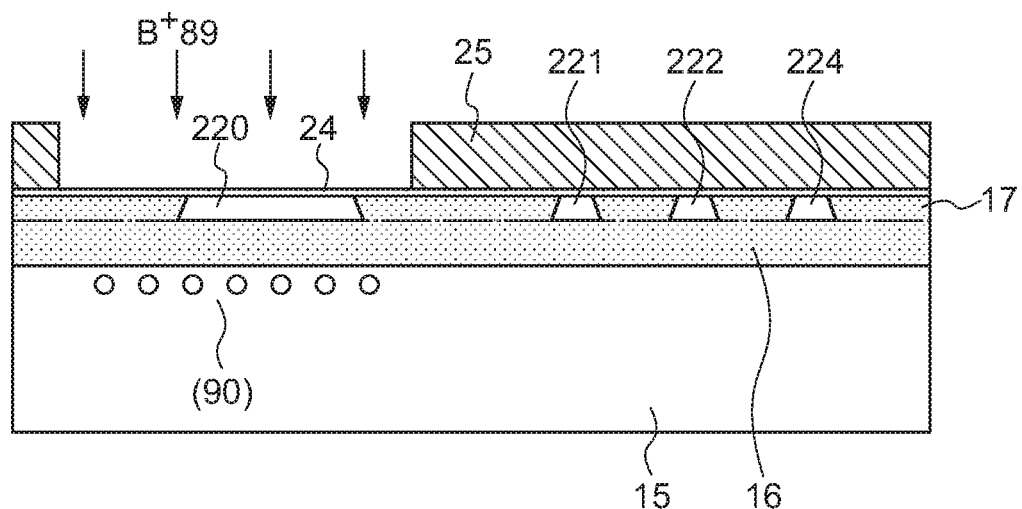
FIG. 15 is a process chart related to a process following the process shown in FIG. 14.

Further, as shown in FIG. 15, the gate oxide film 24 is formed on the P-type semiconductor layers 220, 222 and 224 and the surface of the field oxide film 17. The region other than the region in which the N-type well diffusion layer 90 of the first region is to be formed is covered by photoresist 25 aligned with a position of the P-type semiconductor layer 220 which is the active region of the MOS-type transistor 82. Further, as a concrete example, $P^+(P^+89)$ is implanted as an N-type impurity with an implantation energy of 160 keV, with a dose amount of about 1.0E12 to 1.0E13 $cm^{-2}$ and at a tilt angle of 7 degrees. Thus, a state in which the impurity for forming the N-type well diffusion layer 90 is implanted to the N-type semiconductor layer 15 is attained.

Figure 16:
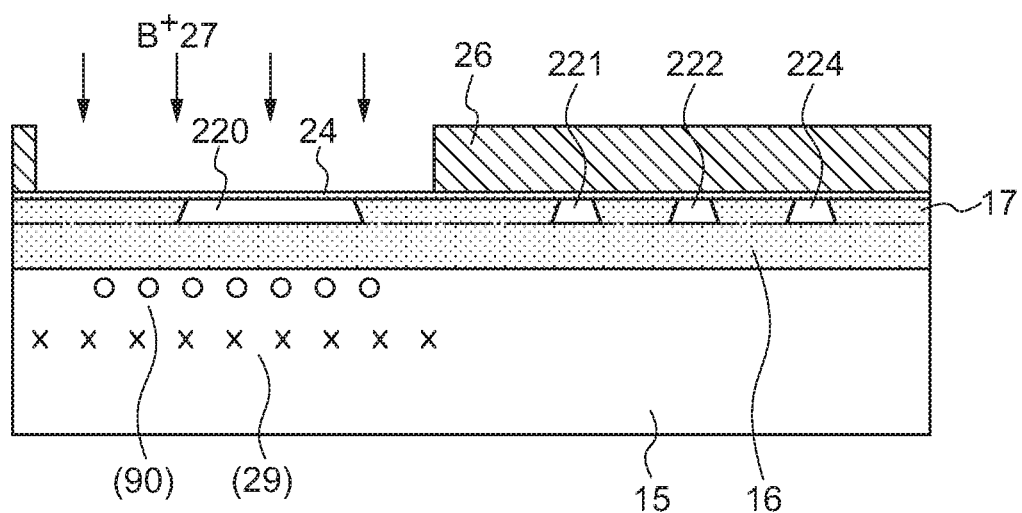
FIG. 16 is a process chart related to a process following the process shown in FIG. 15.
Figure 17:
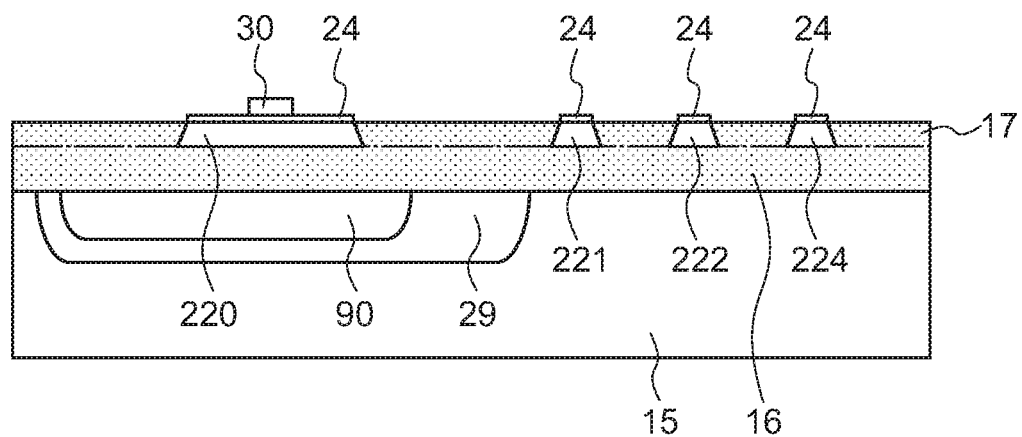
FIG. 17 is a process chart related to a process following the process shown in FIG. 16.

Further, as shown in FIG. 16, after removing the photoresist 25, the region other than the region for forming the P-type well diffusion layer 29, which includes the region in which the N-type impurity has been implanted, is covered by the photoresist 26. The P-type well diffusion layer 29 is implanted with the P-type impurity at a greater depth than the depth to which the N-type impurity has been implanted to from the N-type well diffusion layer 90, so as to form a junction between the N-type well diffusion layer 90 and the P-type well diffusion layer 29. In this embodiment, as a concrete example, $B^+(B^+27)$ is implanted as a P-type impurity with an implantation energy of 220 keV, a dose amount of about 1.0E12 to 1.0E13 $cm^{-2}$ and at a tilt angle of 0 degree. Thus, a state in which the impurity to form the P-type well diffusion layer 29 is implanted to the N-type semiconductor layer 15 is attained.

Figure 18:
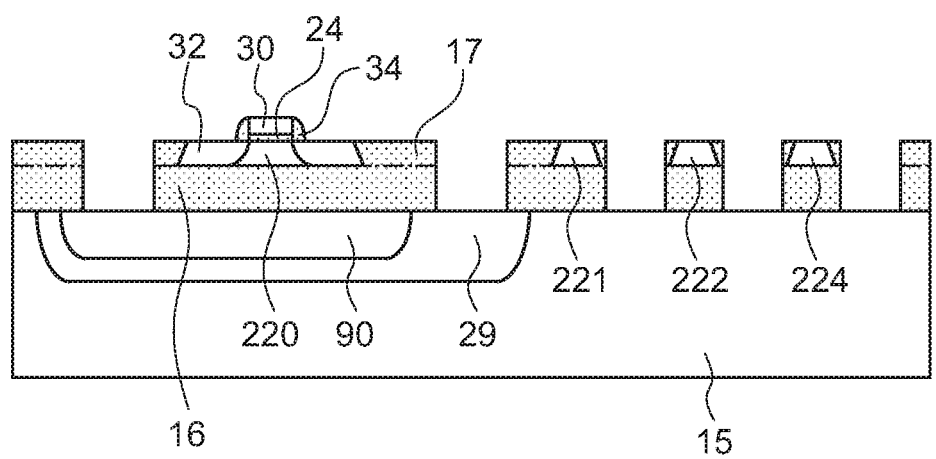
FIG. 18 is a process chart related to a process following the process shown in FIG. 17.

Further, the gate electrode 30 is formed as shown in FIG. 1. Then, as shown in FIG. 18, the P-type semiconductor layer 220 is shallowly implanted with ions at a low concentration to form the LLD region 32. Then, the side wall spacer 34 is formed and ions are implanted with high concentration to form the MOS-type transistor 82. After forming the MOS-type transistor 82, the region other than the predetermined regions corresponding to the respective extraction electrodes of P-type and N-type (electrodes 70, 74, 76, 78 and 94) are covered by the photoresist and etched. Thereafter, the photoresist is removed.

Figure 19:
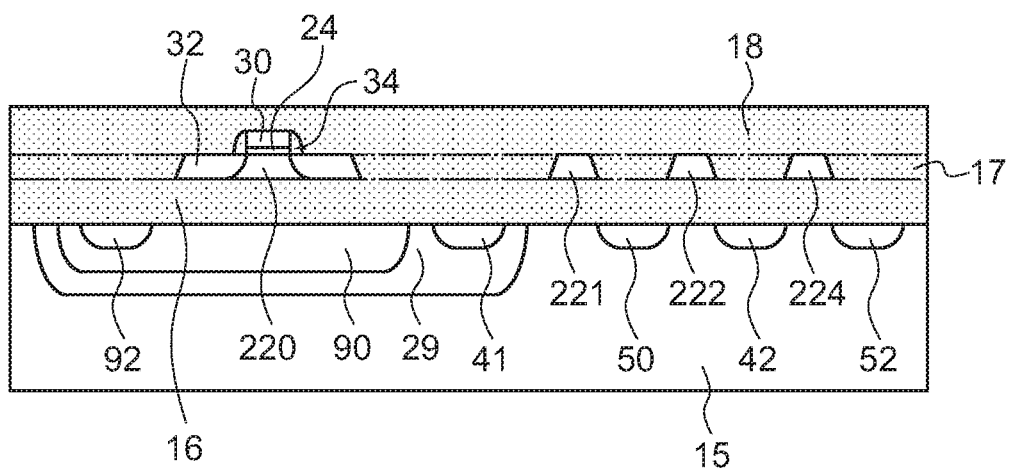
FIG. 19 is a process chart related to a process following the process shown in FIG. 18.

Further, N-type impurity is implanted to the region in which the N-type extraction electrode regions 50 and 52, which also serve as cathode electrodes of the diode 84, and the N-type extraction electrode region 92 are formed. Thus, the N-type extraction electrode regions 50, 52 and 92 are formed as shown in FIG. 19. Further, a state in which the impurity concentration of the N-type extraction electrode region 92 is higher than that in the N-type well diffusion layer 90 is attained.

Further, P-type impurity is implanted to the region in which the P-type extraction electrode region 42, which also serve as the anode electrode of the diode 84, and the P-type extraction electrode region 41 are formed. Thus, the P-type extraction electrode region 42 and the P-type extraction electrode region 41 are formed as shown in FIG. 19. Further, a state in which the impurity concentration of the P-type extraction electrode region 41 is higher than that in the P-type well diffusion layer 29 is attained. After forming the P-type extraction electrode regions 40 and 41, and the N-type extraction electrode regions 50, 52 and 92, the interlayer film 18 is formed as shown in FIG. 19.

Figure 20:
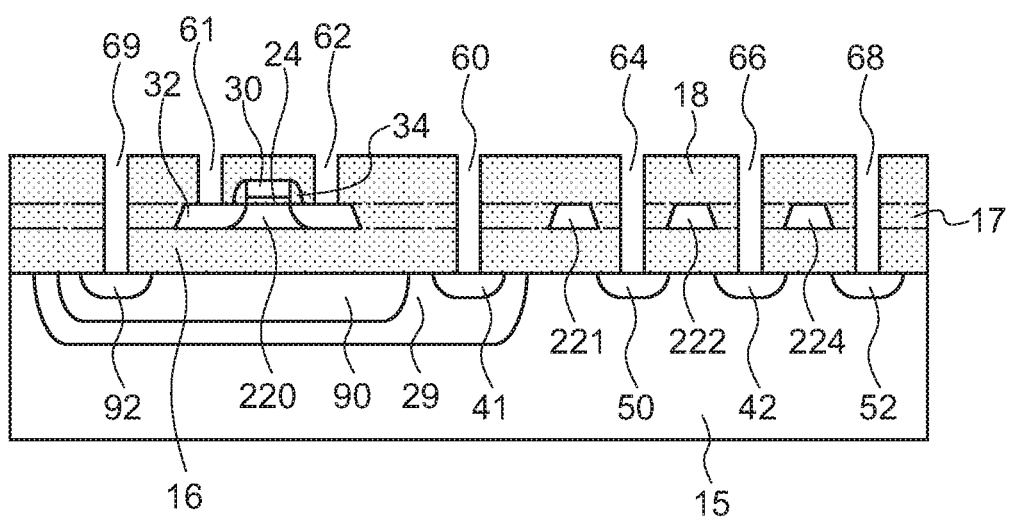
FIG. 20 is a process chart related to a process following the process shown in FIG. 19.

Further, etching is performed on the region other than the region in which electrodes (the extraction electrodes of the P-type semiconductor layer 220) of the MOS-type transistor 82 and the extraction electrodes of the N-type semiconductor layer 15 are to be formed. Thus, contact holes 60, 61, 62, 64, 66, 68, and 69 are formed as shown in FIG. 20. Then, a metal layer is deposited by sputtering.

Figure 21:
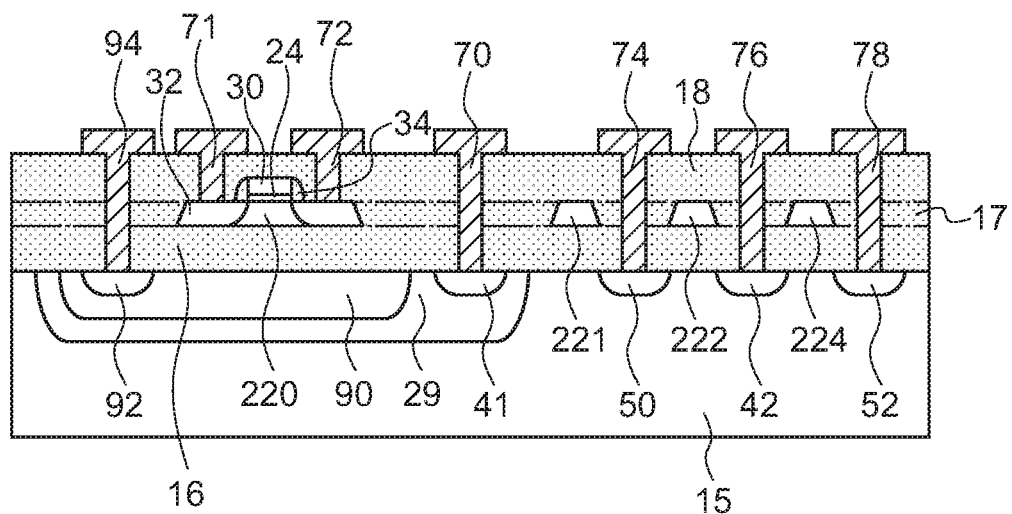
FIG. 21 is a cross-sectional view of an example of a schematic configuration of the semiconductor device according to the second embodiment.
Figure 22:
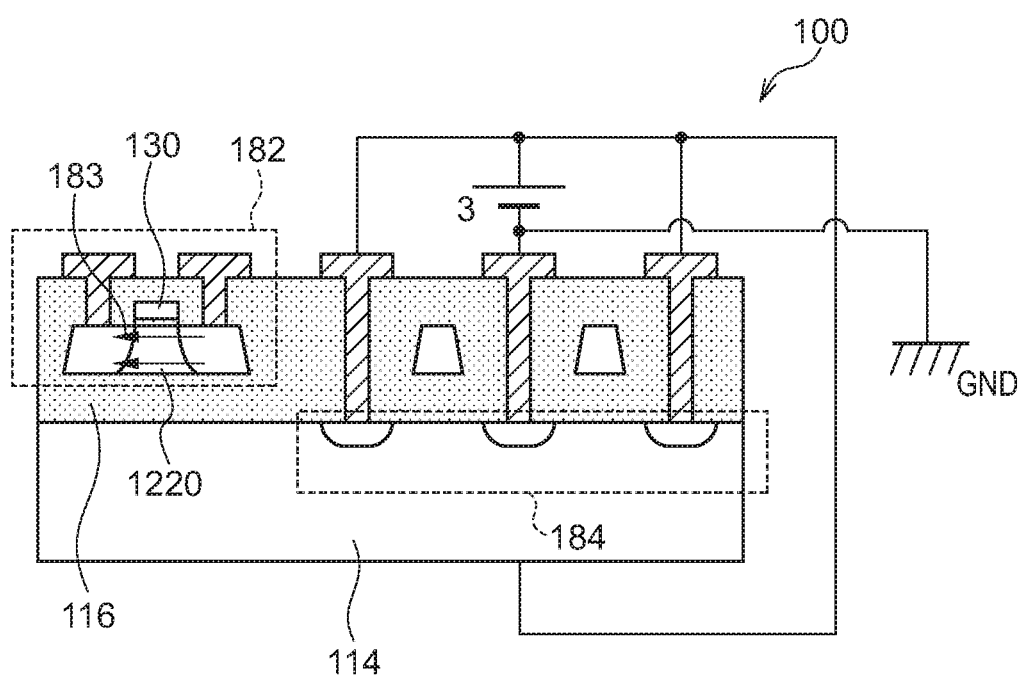
FIG. 22 is a cross-sectional view of an example of a schematic configuration of a conventional semiconductor device.

Finally, etching is performed on the part of the metal layer formed by sputtering other than the region in which the electrodes are formed. Thus, the extraction electrodes 70, 71, 72, 74, 76, 78, and 94 are formed as shown in FIG. 21. According to these processes described above, the semiconductor device 11 of this embodiment is manufactured.

In this manner, according to the method for manufacturing the semiconductor device 11 of this embodiment, since the N-type well diffusion layer 90 and the P-type well diffusion layer 29 are formed after forming the P-type semiconductor layers 220, 221, 222 and 224 which are the active regions in the P-type semiconductor layer 22, it is possible to adjust a position of the photolithography using the active region (the P-type semiconductor layer 220) in a photolithography process before implanting the impurity for forming each of the well diffusion layers. Moreover, since the MOS-type transistor 82 is formed in the P-type semiconductor layer 220 after implanting the impurity for forming each of well diffusion layers, a sufficient heat treatment can be applied to the N-type well diffusion layer 90 and the P-type well diffusion layer 29.

As described above, according to the method for manufacturing the semiconductor device 11 of this embodiment, the N-type well diffusion layer 90 and the P-type well diffusion layer 29 are formed in the active region (the P-type semiconductor layer 220) formed in the P-type semiconductor layer 22 with a minimum shift length during photolithography adjustment and the region implanted with impurity is amply treated with heat after implanting the impurity to the N-type semiconductor layer 15 for forming each of the well diffusion layers. Therefore, the N-type well diffusion layer 90 and the P-type well diffusion layer 29 can be formed to a greater depth in the N-type semiconductor layer 15.

In the first embodiment described above, a configuration is described in which a first-conductive-type is defined as P-type, a second-conductive-type is defined as N-type, the P-type semiconductor layer 22 is formed, via the buried oxide film 16, on the N-type semiconductor layer 14 including the P-type well diffusion layer 28, and the semiconductor device 10 is configured by the MOS-type transistor 82 including the P-type semiconductor layer 22. However, it is not limited to thereto, the semiconductor device may be provided in which the first-conductive-type is defined as N-type and the second-conductive-type is defined as P-type, the N-type semiconductor layer is formed, via the buried oxide film, on the P-type semiconductor layer including the N-type well diffusion layer, and the semiconductor device is configured by the MOS-type transistor including the N-type semiconductor layer. In a same manner for the second embodiment, although a configuration in which a first-conductive-type is defined as P-type and a second-conductive-type is defined as N-type, the buried oxide film 16 is positively charged, it is not limited to thereto. The semiconductor device may be provided in which the first-conductive-type is defined as N-type and the second-conductive-type is defined as P-type, the N-type semiconductor layer is formed, via the buried oxide film, on the P-type semiconductor layer including the N-type well diffusion layer in which the P-type well diffusion layer are formed, the buried oxide film 16 is negatively charged, and the semiconductor device is configured by the MOS-type transistor including the N-type semiconductor layer.

The invention claimed is:

1. A semiconductor device, comprising:
   a silicon on insulator (SOI) substrate that includes a first surface;
   a first semiconductor layer that includes a second surface opposite to the first surface, and a third surface opposite to the second surface, the third surface having a semiconductor element disposed thereon;
   a first oxide film layer that is formed in contact with the first surface and the second surface;
   a second oxide film layer that covers the third surface and the semiconductor element;
   a first diffusion layer that is formed on the first surface, the first diffusion layer, in a plan view, including and overlapping with a region on the first surface that corresponds to the first semiconductor layer when the first semiconductor layer is as seen in the plan view;
   a first electrode that is connected to a first reference potential and that penetrates through the first oxide film layer and the second oxide film layer to connect to the first diffusion layer; and
   a diode including:
      a second diffusion layer that is connected to a second reference potential and that is formed in a part of a region of the first surface corresponding to a region that is adjacent to the first diffusion layer in the plan view; and
      a second semiconductor layer that is formed to be co-planar with the first semiconductor layer in a cross-sectional view, a region of the second semiconductor layer corresponding to the first surface being disposed in a region that is sandwiched between the first diffusion layer and the second diffusion layer in the plan view.

2. The semiconductor device according to claim 1, further comprising:
   a third diffusion layer that is formed on the first surface, and that is disposed in a region that is sandwiched between a region corresponding to the first semiconductor layer and a region corresponding to the second semiconductor layer in the plan view.

3. The semiconductor device according to claim 2, wherein the third diffusion layer is connected to the first reference potential.

4. The semiconductor device according to claim 2, further comprising:
   a fourth diffusion layer formed on the first surface, and that is sandwiched between the region corresponding to the first semiconductor layer and a region corresponding to the third diffusion layer in the plan view.

5. The semiconductor device according to claim 4, wherein
   the fourth diffusion layer is connected to the second reference potential.

* * * * *